(12) United States Patent
Yang et al.

(10) Patent No.: US 12,384,967 B2
(45) Date of Patent: Aug. 12, 2025

(54) ETCHANT

(71) Applicants: Samsung Display Co., Ltd., Yongin-si (KR); DONGWOO FINE-CHEM Co., Ltd., Iksan-si (KR)

(72) Inventors: Shinhyuk Yang, Yongin-si (KR); Beomsoo Kim, Iksan-si (KR); Hyeonsu Cho, Iksan-si (KR); Yujin Kim, Yongin-si (KR); Jeehoon Kim, Yongin-si (KR); Youngjin Yoon, Iksan-si (KR); Eunwon Lee, Iksan-si (KR); Donghan Kang, Yongin-si (KR)

(73) Assignees: Samsung Display Co., Ltd., Yongin-si (KR); DONGWOO FINE-CHEM Co., Ltd., Iksan-si (KR)

( * ) Notice: Subject to any disclaimer, the term of this patent is extended or adjusted under 35 U.S.C. 154(b) by 263 days.

(21) Appl. No.: 18/169,798

(22) Filed: Feb. 15, 2023

(65) Prior Publication Data

US 2023/0295501 A1    Sep. 21, 2023

(30) Foreign Application Priority Data

Mar. 21, 2022   (KR) ........................ 10-2022-0034935

(51) Int. Cl.
   *C09K 13/06*    (2006.01)
(52) U.S. Cl.
   CPC ................... *C09K 13/06* (2013.01)
(58) Field of Classification Search
   None
   See application file for complete search history.

(56) References Cited

U.S. PATENT DOCUMENTS

| | | | |
|---|---|---|---|
| 8,262,928 B2 | 9/2012 | Kim et al. | |
| 8,637,399 B2 | 1/2014 | Park et al. | |
| 10,941,342 B2 | 3/2021 | Kim et al. | |
| 10,995,269 B2 | 5/2021 | Lee et al. | |
| 2012/0153287 A1* | 6/2012 | Park | H01L 27/1259 |
| | | | 252/79.3 |
| 2015/0140712 A1* | 5/2015 | Kim | C23F 1/18 |
| | | | 252/79.3 |
| 2015/0307779 A1* | 10/2015 | Choung | C23F 1/18 |
| | | | 252/79.3 |
| 2020/0172807 A1 | 6/2020 | Kim et al. | |
| 2023/0295504 A1* | 9/2023 | Yang | C09K 13/08 |
| | | | 252/79.3 |

FOREIGN PATENT DOCUMENTS

| | | |
|---|---|---|
| KR | 10-2013-0051239 A | 5/2013 |
| KR | 10-1619380 B1 | 5/2016 |
| KR | 10-1745721 B1 | 6/2017 |

(Continued)

*Primary Examiner* — Allan W. Olsen
(74) *Attorney, Agent, or Firm* — Womble Bond Dickinson (US) LLP

(57) ABSTRACT

An etchant including: persulfate; a fluorine-containing compound; a chlorine-containing compound; a cyclic amine compound; an inorganic acid; sulfate; and water, wherein a tip control index (Y) of the etchant is a value of at least about 45.0 and not more than about 70.0, the tip control index (Y) being a value calculated by Equation 1:

$$Y=1.0\times10^{-3}\times M(X1)+1.0\times10^{-1}\times M(X2)+5.0\times10^{-2}\times M(X3)+1.5\times M(X1)\times M(X2)+2.0\times10^{-1}\times M(X1)\times M(X3)+2.0\times10^{-1}\times M(X2)\times M(X3) \quad \text{Equation 1}$$

The description of Equation 1 is as in the specification.

20 Claims, 10 Drawing Sheets

(56) References Cited

FOREIGN PATENT DOCUMENTS

| KR | 10-1805185 B1 | 12/2017 |
|----|---------------|---------|
| KR | 10-2018-0058610 A | 6/2018 |
| KR | 10-2020-0011394 A | 2/2020 |
| KR | 10-2020-0068131 A | 6/2020 |
| KR | 10-2020-0112674 A | 10/2020 |

\* cited by examiner

ETCHANT

CROSS-REFERENCE TO RELATED APPLICATION

This application claims priority to and the benefit of Korean Patent Application No. 10-2022-0034935, filed on Mar. 21, 2022, in the Korean Intellectual Property Office, the disclosure of which is incorporated by reference herein in its entirety.

BACKGROUND

1. Field

Embodiments of the present disclosure described herein relate to an etchant.

2. Description of the Related Art

In accordance with the progress in the field of display devices that express one or more suitable electrical signal information (e.g., in the field of informational technology), one or more suitable flat display devices with excellent or suitable characteristics such as reduced thickness, reduced weight, and low power consumption are being studied and developed. Among these display devices, organic light-emitting display devices may be manufactured to be lightweight and thin, and have the advantages of relatively wide viewing angles and rapid response rates, thus drawing attention as next-generation display devices.

SUMMARY

Aspects of embodiments are directed toward an etchant capable of etching a multilayer film.

Additional aspects will be set forth in part in the description which follows and, in part, will be apparent from the description, or may be learned by practice of the presented embodiments of the disclosure.

According to an embodiment, an etchant includes: persulfate; a fluorine-containing compound; a chlorine-containing compound; a cyclic amine compound; an inorganic acid; sulfate; and water, the etchant having a tip control index (Y) which is a value of at least about 45.0 and not more than about 70.0, the tip control index (Y) being a value calculated by <Equation 1>:

$$Y=1.0\times10^{-3}\times M(X1)+1.0\times10^{-1}\times M(X2)+5.0\times10^{-2}\times M(X3)+1.5\times M(X1)\times M(X2)+2.0\times10^{-1}\times M(X1)\times M(X3)+2.0\times10^{-1}\times M(X2)\times M(X3) \quad \text{Equation 1}$$

wherein, in Equation 1,

M(X1) indicates wt % of the chlorine-containing compound with respect to 100 wt % in total of the etchant, M(X2) indicates wt % of the sulfate with respect to 100 wt % in total of the etchant, and M(X3) indicates wt % of the water with respect to 100 wt % in total of the etchant.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression "at least one of a, b or c" indicates only a, only b, only c, both (e.g., simultaneously) a and b, both (e.g., simultaneously) a and c, both (e.g., simultaneously) b and c, all of a, b, and c, or variations thereof.

The disclosure may include one or more suitable modifications and one or more suitable embodiments, and specific embodiments will be illustrated in the accompanying drawings and described in more detail in the detailed description. The effects and features of the present disclosure and way to implement the same will become clear with reference to the embodiments described below in more detail along with the drawings. However, the disclosure is not limited to the embodiments disclosed below and may be implemented in one or more suitable forms.

As used herein, the terms "first," "second," etc., are used only to distinguish one component from another, not for purposes of limitation.

As used herein, the singular forms "a," "an," and "the" are intended to include the plural forms as well, unless the context clearly indicates otherwise.

As used herein, the terms such as "including," "having," and/or the like are intended to indicate the existence of the features or elements disclosed in the specification, and are not intended to preclude the possibility that one or more other features or elements may exist or may be added.

As used herein, when an element such as a layer, a film, a region or a component is referred to as being "on" another element, it can be "directly on" the other element, or one or more intervening layers, films, regions, or components may also be present.

In the drawings, the sizes of elements are exaggerated or reduced for ease of description. For example, the size or thickness of each element shown in the drawings are arbitrarily illustrated for ease of description, and thus the present disclosure is not limited thereto.

According to an embodiment, an etchant includes: persulfate; a fluorine-containing compound; a chlorine-containing compound; a cyclic amine compound; an inorganic acid; sulfate; and water, the etchant having a tip control index (Y) which is a value of at least about 45.0 and not more than about 70.0, the tip control index (Y) being a value calculated by <Equation 1>:

$$Y=1.0\times10^{-3}\times M(X1)+1.0\times10^{-1}\times M(X2)+5.0\times10^{-2}\times M(X3)+1.5\times M(X1)\times M(X2)+2.0\times10^{-1}\times M(X1)\times M(X3)+2.0\times10^{-1}\times M(X2)\times M(X3) \quad \text{Equation 1}$$

wherein, in Equation 1,

M(X1) indicates wt % of the chlorine-containing compound with respect to 100 wt % in total of the etchant, M(X2) indicates wt % of the sulfate with respect to 100 wt % in total of the etchant, and M(X3) indicates wt % of the water with respect to 100 wt % in total of the etchant.

In one or more embodiments, the persulfate in the etchant may include ammonium persulfate, sodium persulfate, potassium persulfate, or one or more combinations thereof. The persulfate is a main etch component and may control the etch rate. For example, the persulfate may include ammonium persulfate or ammonium peroxide disulfate. For example, the persulfate may be ammonium persulfate or ammonium peroxide disulfate. In some embodiments, when a display device is manufactured using the etchant in which the persulfate includes sodium (Na) (for example, the persulfate is sodium peroxide disulfate), a silicon (Si)-containing precipitate (for example, $Na_2SiF_6$) may be generated by reaction with a glass substrate. However, when the persulfate does not include Na, the amount of the Si-containing precipitate generated may be lowered, thus resulting in a defect rate reduction of display devices. In some embodiments, when manufacturing a display device using the etchant in which the persulfate includes potassium (K) (for example, when the persulfate is potassium peroxide disulfate), the decomposition rate may increase over time and the manufacturing time may increase. However, when the persulfate does not include K, the effects of increased stability and reduced manufacturing time may be obtained.

For example, the persulfate may be about 3.0 wt % or greater and about 15.0 wt % or less with respect to 100 wt % in total of the etchant. When the persulfate is included in an amount of less than about 3.0 wt %, etching may not occur or the etch rate may be reduced. When the persulfate included exceeds about 15.0 wt %, it is difficult to control the etch rate, and anions excessively increase, thus lowering etch uniformity of the multilayer film.

In one or more embodiments, the fluorine-containing compound in the etchant may be ammonium fluoride, sodium fluoride, potassium fluoride, ammonium bifluoride, sodium bifluoride, potassium bifluoride, or one or more combinations thereof. The fluorine-containing compound may reduce residues and/or tips that may be generated during etching. The fluorine-containing compound may be a compound in which fluoride ions or polyatomic fluoride ions are dissolved in solution.

For example, the fluorine-containing compound may be about 0.10 wt % or greater and about 2.0 wt % or less with respect to 100 wt % in total of the etchant. In other embodiments, the fluorine-containing compound may be about 0.6 wt % or more and about 1.0 wt % or less. When the fluorine-containing compound is included in an amount of less than about 0.10 wt %, the etch rate may be reduced, thus generating residues and/or tips. When the fluorine-containing compound is included in more than about 2.0 wt %, a substrate (for example, a substrate constituting the base of a wire, a substrate including wires, and/or a silicon-based insulating layer) may be damaged. The chlorine-containing compound may be a compound in which chloride ions are dissolved in solution.

In one or more embodiments, the chlorine-containing compound in the etchant may include hydrochloric acid, sodium chloride, potassium chloride, ammonium chloride, iron (III) chloride, sodium perchlorate, potassium perchlorate, ethanesulfonyl chloride, methanesulfonyl chloride, or one or more combinations thereof. The chlorine-containing compound improves critical dimension (CD) loss of patterned wires by improving the etch rate, and thus may improve process margin. In some embodiments, by preventing or reducing overetching of wires, the yield may be improved. Critical dimension (CD) loss is one of the pattern profile failures occurring when there is no large difference in etch rate between those in vertical and horizontal directions, and may refer to a failure in which wiring is not normally achieved due to a reduced horizontal distance between the end of a mask pattern for etching (for example, a photoresist pattern) and the end of an etched pattern.

For example, the chlorine-containing compound may be about 0.01 wt % or greater and about 1.0 wt % or less with respect to 100 wt % in total of the etchant. In other embodiments, the fluorine-containing compound may be about 0.01 wt % or greater and about 0.5 wt % or less. When the chlorine-containing compound is included in an amount of less than about 0.01 wt %, the etch rate may be reduced, thus generating residues to occur. In some embodiments, because overetching of wiring cannot be prevented or suitably reduced, the yield may be reduced. When the chlorine-containing compound included to exceed about 1.0 wt %, the etch rate may excessively increase, thus reducing etch uniformity.

In one or more embodiments, the cyclic amine compound in the etchant may include 5-aminotetrazole, imidazole, indole, purine, pyrazole, pyridine, pyrimidine, pyrrole, pyrrolidine, pyrroline, 5-methyltetrazole, 1-methyl-5-aminotetrazole, 1-ethyl-5-aminotetrazole, or one or more combinations thereof. The cyclic amine compound may control the etch rate, improve etch uniformity, and form a profile.

For example, the cyclic amine compound may be about 0.10 wt % or greater and about 2.0 wt % or less with respect to 100 wt % in total of the etchant. When the cyclic amine compound is included in an amount of less than about 0.10 wt %, the etch rate is not controllable, thus causing overetching or substantially non-uniform etching. When the cyclic amine compound included exceeds about 2.0 wt %, the etch rate may be reduced, thus lowering efficiency.

In one or more embodiments, the inorganic acid in the etchant may include nitric acid, sulfuric acid, phosphoric acid, phosphorous acid, or one or more combinations thereof. The inorganic acid may be an auxiliary oxidizer for etching.

For example, the inorganic acid may be about 0.10 wt % or greater and about 5.0 wt % or less with respect to 100 wt % in total of the etchant. When the inorganic acid is included in an amount of less than about 0.10 wt %, the etch rate may be reduced, thus causing residues or a failure in profile to occur. When the inorganic acid included exceeds about 5.0 wt %, overetching may occur, or cracking in photoresist may occur, thus lowering productivity.

In one or more embodiments, the sulfate in the etchant may include metal sulfate, an organic acid sulfate, or any combinations thereof. For example, the sulfate may include sodium sulfate, potassium sulfate, copper sulfate, titanium sulfate, ferric sulfate, ammonium sulfate, glucosamine sulfate, or one or more combinations thereof. In other embodiments, the sulfate may be sodium sulfate, potassium sulfate, ferric sulfate, or one or more combinations thereof.

For example, the sulfate may be about 0.10 wt % or more and about 7.0 wt % or less with respect to 100 wt % in total of the etchant. In other embodiments, the sulfate may be about 0.5 wt % or more and about 5.0 wt % or less. When the sulfate is included in an amount of less than about 0.10 wt %, the etch rate (for example, the etch rate of a metal oxide film) may be reduced, thus generating residues. When the sulfate is included in more than about 7.0 wt %, the etch rate (for example, the etch rate of a metal film or a copper metal film) may be reduced.

In one or more embodiments, the persulfate in the etchant may include ammonium persulfate, potassium persulfate, or a combination thereof, the fluorine-containing compound may include ammonium fluoride, potassium fluoride, ammonium bifluoride, potassium bifluoride, or one or more combinations thereof, the chlorine-containing compound may include hydrochloric acid, potassium chloride, ammonium chloride, potassium perchlorate, ethanesulfonyl chloride, methansulfonyl chloride, or one or more combinations thereof, and the sulfate may include potassium sulfate, copper sulfate, titanium sulfate, ferric sulfate, ammonium sulfate, glucosamine sulfate, or one or more combinations thereof.

In other embodiments, the etchant may include, with respect to 100 wt % in total of the etchant, the persulfate in an amount of at least about 3.0 wt % and not more than about 15.0 wt % or less, the fluorine-containing compound in an amount of at least about 0.10 wt % and not more than about 2.0 wt %, the chlorine-containing compound in an amount of at least about 0.01 wt % and not more than about 1.0 wt %, the cyclic amine compound in an amount of at least about 0.10 wt % and not more than about 2.0 wt %, the inorganic acid in an amount of at least about 0.10 wt % and not more than about 5.0 wt %, and the sulfate in an amount of at least about 0.10 wt % and not more than about 7.0 wt %.

In one or more embodiments, the water in the etchant may be deionized water for semiconductor processing. For example, the water may be deionized water of about 18 MΩ/cm or more. In other embodiments, the water may be included as the remainder. The remainder refers to the quantity needed to reach 100 wt % of the total weight of the etchant including essential component(s) and/or other component(s) of the present disclosure.

For example, an amount of the water may be at least about 75 wt % and not more than about 88 wt %.

The tip control index (Y) is a value of at least about 45.0 and not more than about 70.0 and is calculated by <Equation 1> herein.

The tip control index (Y) is an index for controlling the amount of the etchant to enable the multilayer film to be etched and reduce a taper angle so as to prevent or reduce tip formation. For the etchant in which Y is less than about 45.0 or greater than about 70, the etch rate of the upper portion of the multilayer film is lower than the etch rate of the lower portion of the multilayer film, and thus, in the multilayer with such etch rates, a tip occurrence possibility may be high and the taper angle may be increased. For the etchant in which Y is about 45.0 or more and not more than about 70, the etch rate of the upper portion of the multilayer is increased, and in the multilayer film with such an etch rate, a tip occurrence possibility may be low and the taper angle may be reduced. For example, when manufacturing a display device using the etchant satisfying the range of Y, the multilayer film (for example, a film of Ti/Cu/Ti/ITO structure) can be concurrently (e.g., simultaneously) etched, and a tip occurrence possibility of the multilayer (for example, tip occurrence in ITO of the film of Ti/Cu/Ti/ITO structure) is reduced, thus resulting in an appropriate or suitable taper angle.

For example, by controlling the amount of the etchant such that the range of Y is satisfied, the etchant with excellent or suitable etching efficiency and etch uniformity can be efficiently developed, and a high-definition display device can be manufactured.

For example, Y may be at least about 45.3 and not more than about 68.0.

In one or more embodiments, the etchant may further include a surfactant, a metal ion sequestering agent, an anti-corrosive agent, a heat stabilizer, a thickener, glycol, or one or more combinations thereof.

In one or more embodiments, the etchant may be for etching a metal film, a metal oxide film, or a combination thereof.

In other embodiments, the etchant may be for etching a metal film or a metal oxide film.

For example, the metal film may be a single-layer film or a multilayer film.

For example, the metal film may include copper, titanium, a titanium alloy, or one or more combinations thereof. The titanium alloy may include: titanium; and molybdenum (Mo), tantalum (Ta), chromium (Cr), nickel (Ni), neodymium (Nd), or one or more combinations thereof.

For example, the metal film may include a first metal film, a second metal film, and a third metal film. The first metal film and the third metal film may each independently include titanium or a titanium alloy; and the titanium alloy may include: titanium; and molybdenum (Mo), tantalum (Ta), chromium (Cr), nickel (Ni), neodymium (Nd), or one or more combinations thereof (e.g., the titanium alloy may include titanium; and at least one of molybdenum (Mo), tantalum (Ta), chromium (Cr), nickel (Ni), or neodymium (Nd)). The second metal film may include copper.

For example, the metal oxide film may include an oxide of indium (In), tin (Sn), gallium (Ga), zinc (Zn), or one or more combinations thereof. In other embodiments, the metal oxide film may include an oxide of In; and an oxide of Sn, Ga, Zn, or one or more combinations thereof (e.g., the metal oxide film may include an oxide of: In; and at least one of Sn, Ga, or Zn). In other embodiments, the metal oxide film may be an oxide of In and Sn (for example, ITO).

For example, the first metal film may include titanium, the second metal film may include copper, the third metal film may include titanium, and the metal oxide film may include ITO. However, embodiments are not limited thereto.

Hereinafter, one or more embodiments of the etchant according to the present disclosure will now be described in more detail with reference to the following examples.

Examples 1 to 10 and Comparative Examples 1 to 5

Etchants according to Examples 1 to 10 and Comparative Examples 1 to 5 were prepared to have compositions as in Table 1. In Table 1, % indicates wt %. Then, a Ti/Cu/Ti/ITO quadruple film was formed on a substrate, followed by photoresist patterning on the quadruple film to manufacture samples. Each etchant was placed in a spray-type or kind etching equipment (Model name: ETCHER (TFT), available from SEMES), and the temperature was set to about 28° C., and thereafter, an etching process was performed on each sample to obtain an etched sample. The etching time was about 50 to 200 seconds.

In Table 1, APS is ammonium persulfate, SPS is sodium persulfate, KPS is potassium persulfate, ABF is ammonium bifluoride, ACl is ammonium chloride, NaCl is sodium chloride, ATZ is 5-aminotetrazole, HNO₃ is nitric acid, SS is sodium sulfate, PS is potassium sulfate, and FS is ferric sulfate.

Evaluation Example 1

Figure 1:
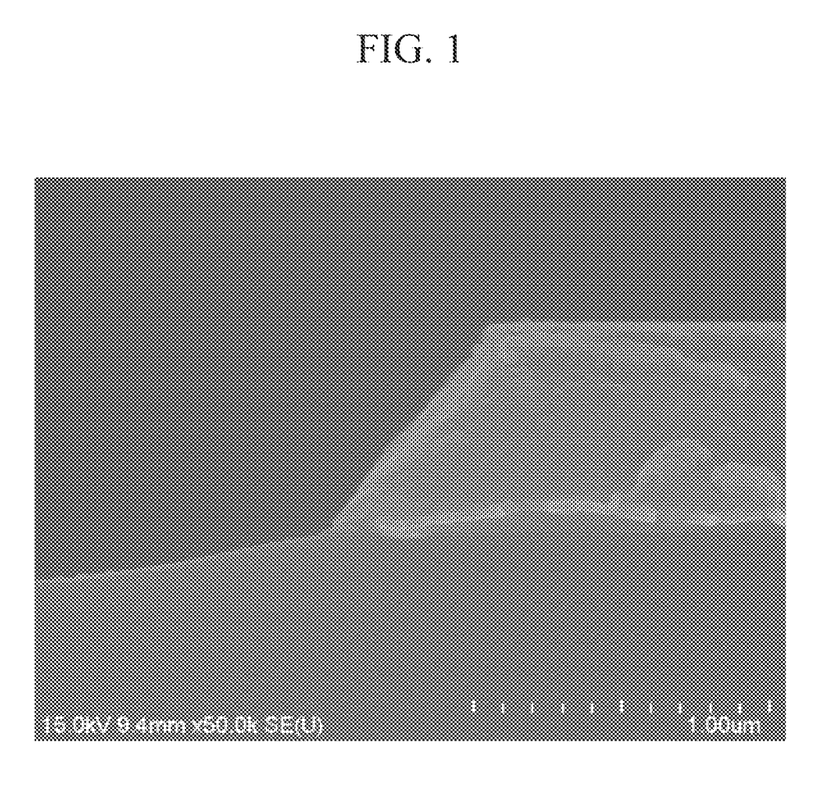
FIGS. 1-5 show results of observation of etched samples of Examples 1-5, respectively, using a scanning electron microscope, according to the present disclosure.
Figure 2:
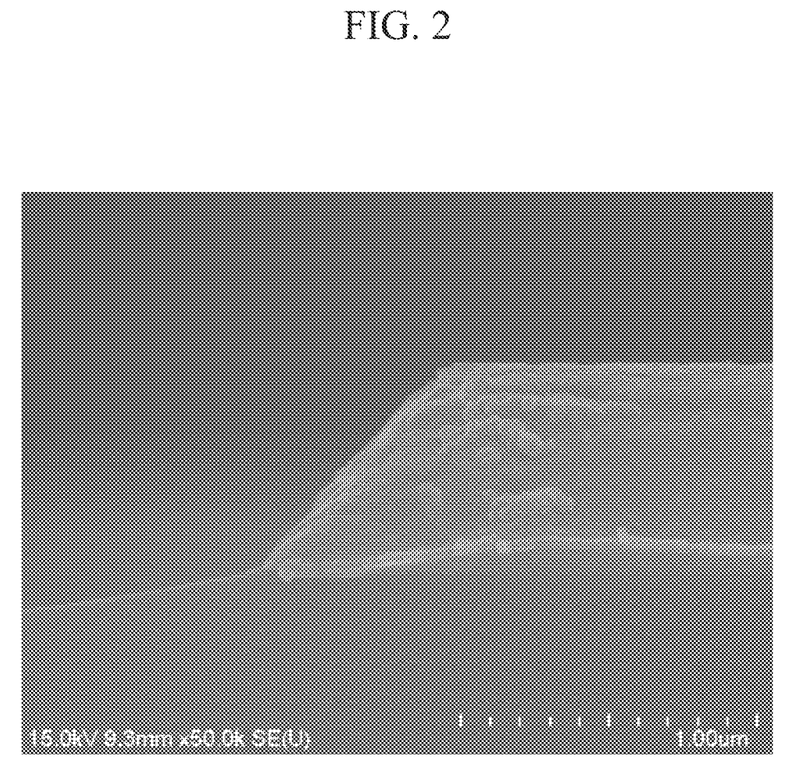
Figure 3:
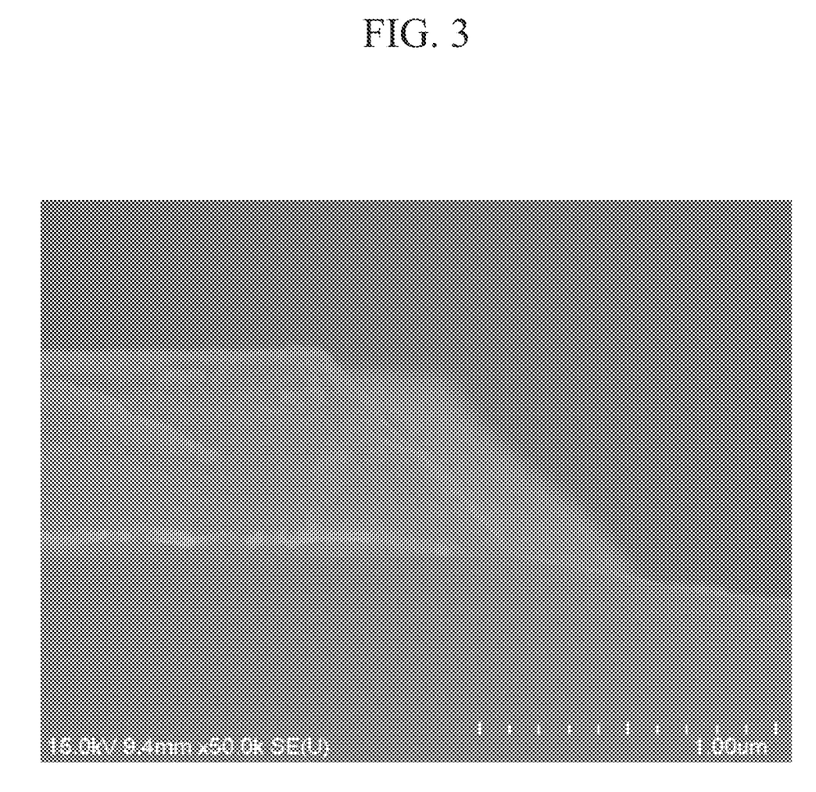
Figure 4:
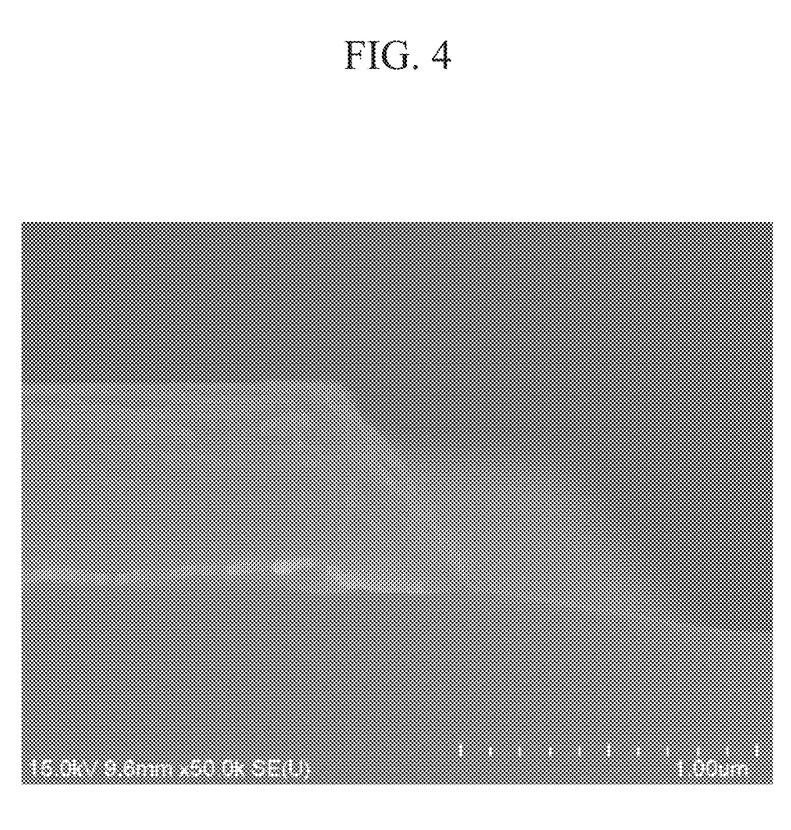
Figure 5:
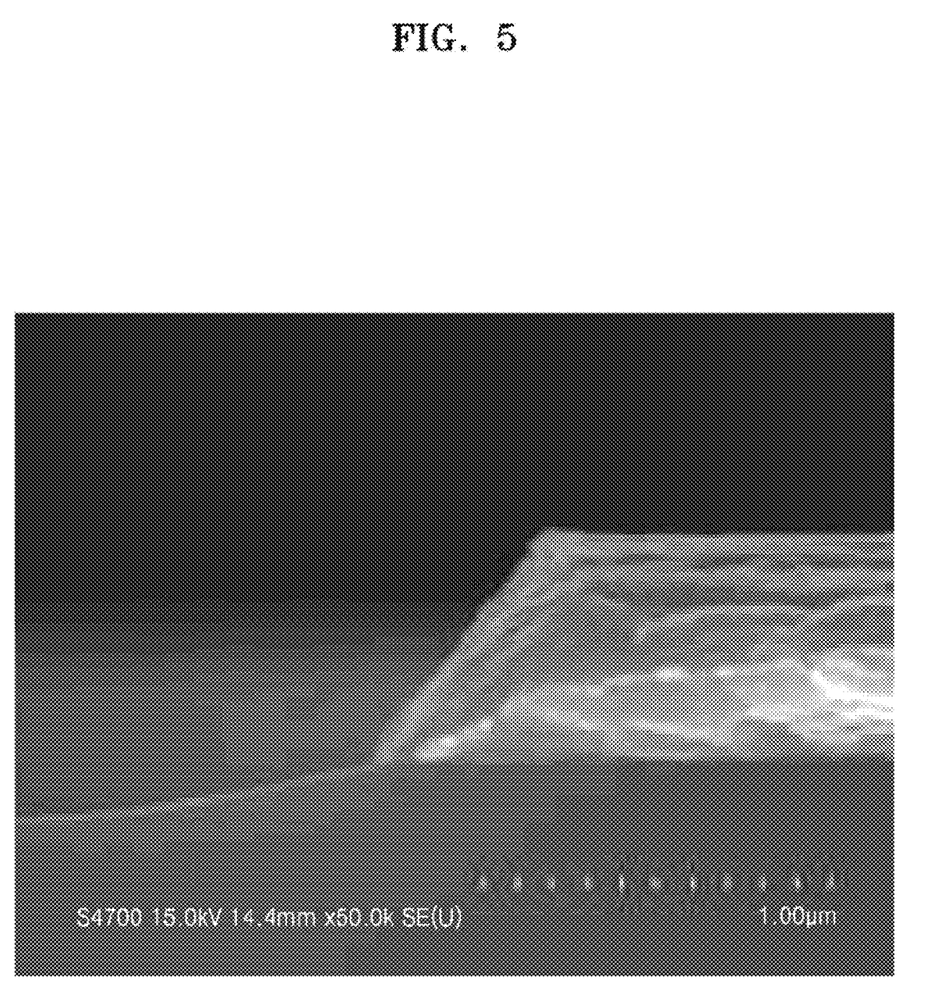
Figure 6:
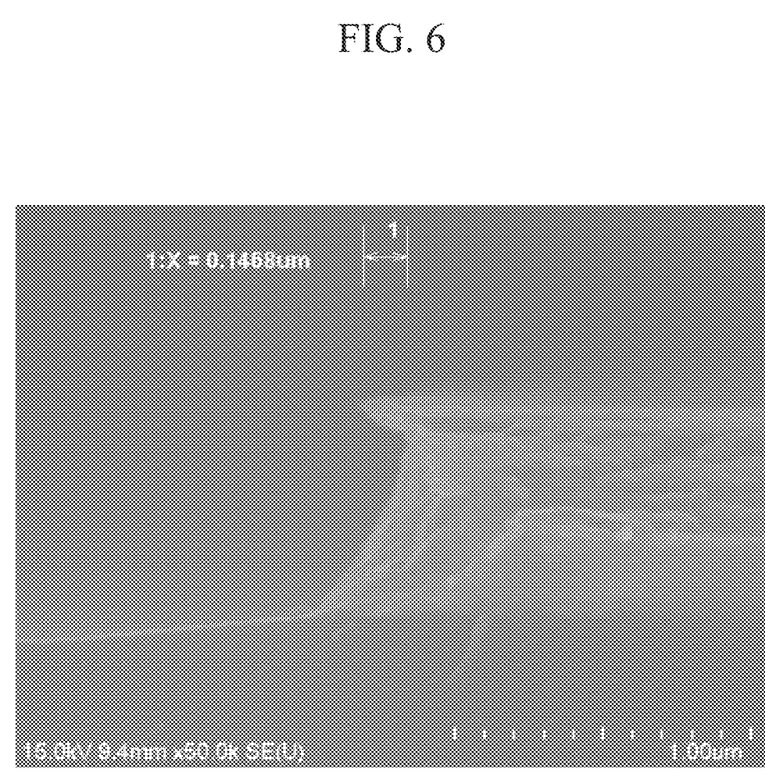
FIGS. 6-10 show results of observation of etched samples of Comparative Examples 1-5, respectively, using a scanning electron microscope according to the present disclosure.
Figure 7:
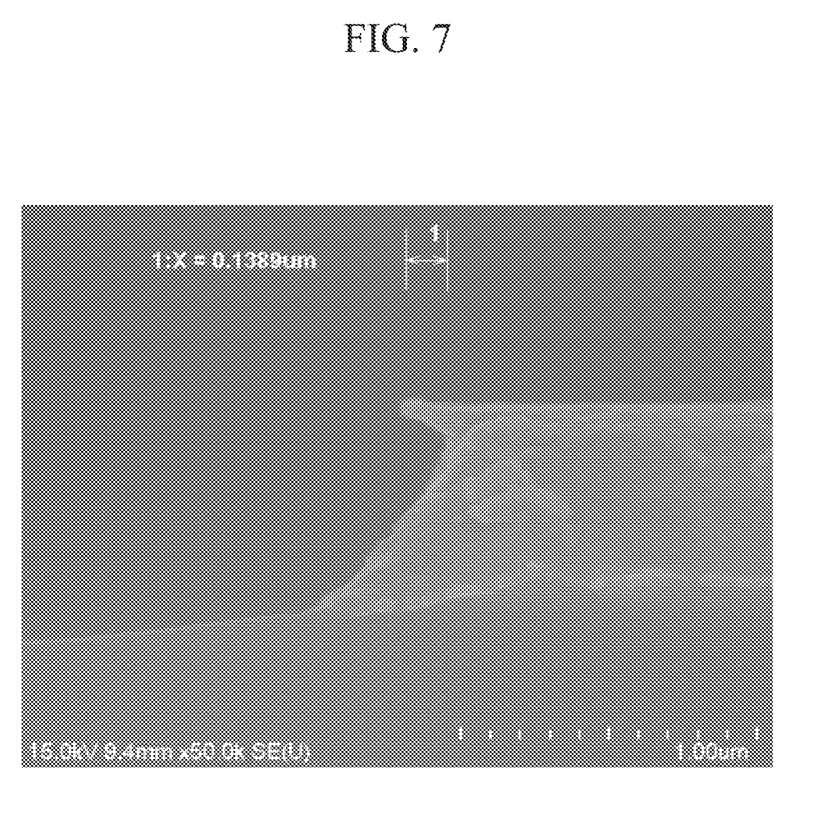
Figure 8:
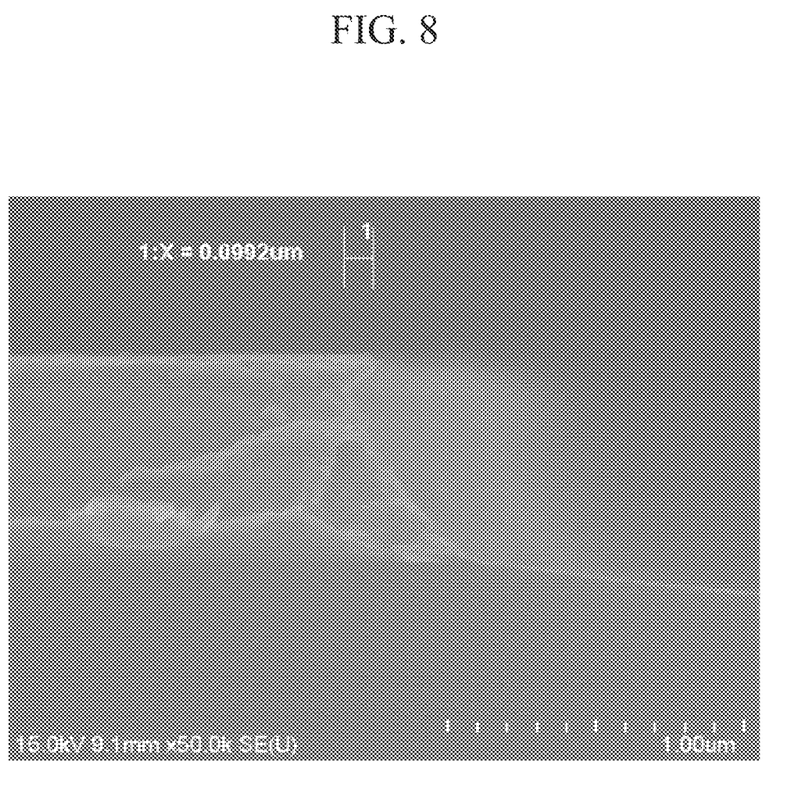
Figure 9:
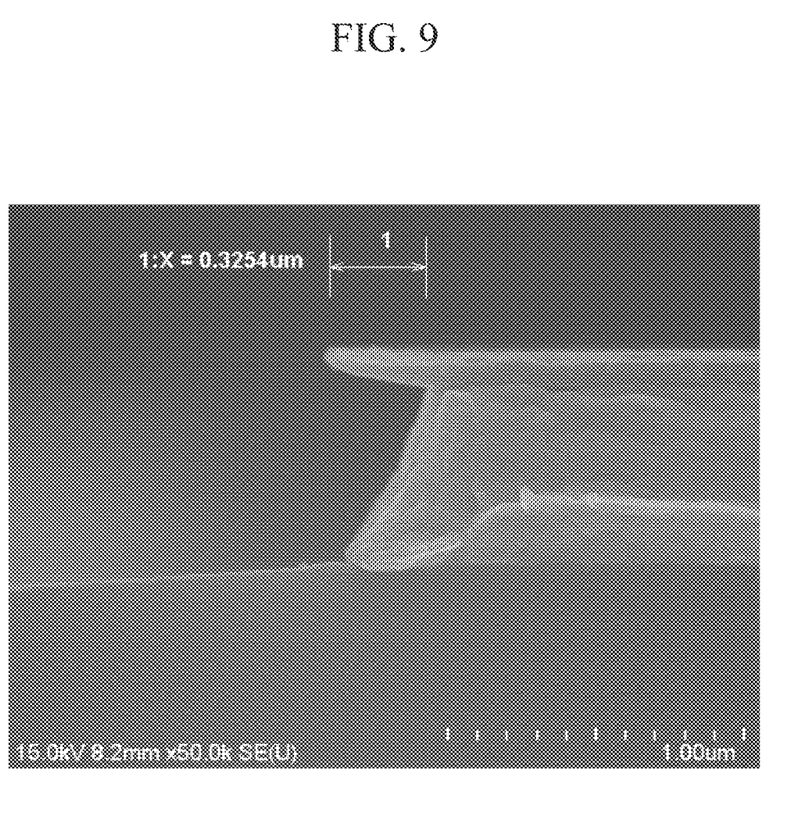
Figure 10:
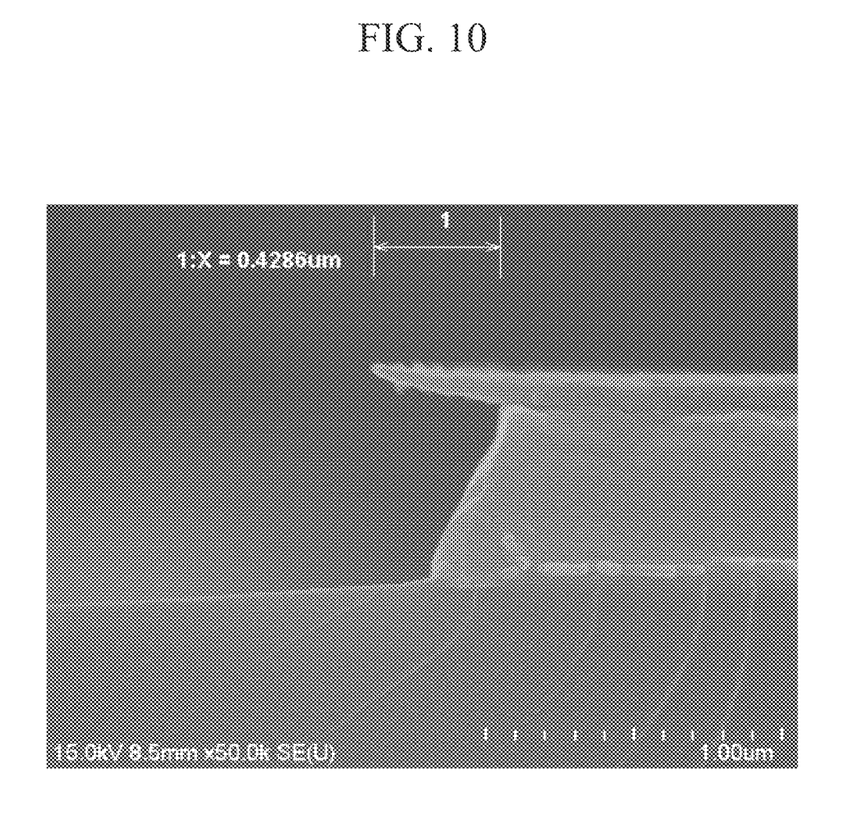

The etched samples according to Examples 1 to 10 and Comparative Examples 1 to 5 were additionally over-etched by 70%, and by measuring profiles of the over-etched samples and Ti/ITO protrusion length of the Cu upper portion, using a scanning electron microscope (SEM, Model: S-4700, available from Hitachi), whether a tip occurred was determined. The results are shown in Table 1. In Table 1, the case where a tip did not occur is marked as "0," and the case where a tip occurred is marked as "X." FIGS. 1 to 5 show profiles of the etched samples of Examples 1 to 5, respectively, and FIGS. 6 to 10 shows profiles of the etched samples of Comparative Examples 1 to 5, respectively.

TABLE 1

|  | Persulfate (%) |  | ABF (%) | Chlorine-containing compound (%) |  | ATZ (%) | $HNO_3$ (%) | Sulfate (%) |  | Deionized water (%) | Y | Tip occurred or not |
|---|---|---|---|---|---|---|---|---|---|---|---|---|
| Example 1 | SPS | 10.0 | 0.6 | ACl | 0.4 | 1.8 | 2.8 | SS | 2.5 | 81.9 | 53.35 | X |
| Example 2 | SPS | 7.0 | 0.9 | NaCl | 0.7 | 1.0 | 3.5 | SS | 2.0 | 84.9 | 52.39 | X |
| Example 3 | KPS | 9.0 | 0.8 | ACl | 1.5 | 0.9 | 2.7 | FS | 2.0 | 83.1 | 67.03 | X |
| Example 4 | SPS | 8.5 | 0.5 | ACl | 0.6 | 1.2 | 4.1 | PS | 2.2 | 82.9 | 52.77 | X |
| Example 5 | SPS | 11.0 | 0.7 | NaCl | 0.015 | 0.7 | 2.0 | PS | 4.0 | 81.6 | 70.08 | X |
| Example 6 | APS | 12.5 | 0.9 | ACl | 1.0 | 2.0 | 3.2 | FS | 1.9 | 78.5 | 52.5 | X |
| Example 7 | APS | 6.5 | 0.6 | ACl | 0.0001 | 1.5 | 3.9 | SS | 2.6 | 84.9 | 48.66 | X |
| Example 8 | APS | 10.5 | 0.5 | ACl | 1.5 | 1.9 | 2.3 | FS | 1.8 | 81.5 | 62.1 | X |
| Example 9 | APS | 9.5 | 0.8 | NaCl | 0.7 | 1.0 | 4.0 | FS | 2.1 | 81.9 | 52.37 | X |
| Example 10 | APS | 11.0 | 0.9 | ACl | 1.3 | 2.0 | 3.3 | PS | 2.4 | 79.1 | 67.41 | X |
| Comparative Example 1 | APS | 13.0 | 0.4 | ACl | 1.0 | 1.3 | 1.9 | PS | 3.0 | 79.4 | 72.29 | ○ |
| Comparative Example 2 | KPS | 10.0 | 0.5 | ACl | 1.1 | 0.7 | 2.7 | FS | 2.7 | 82.3 | 71.39 | ○ |
| Comparative Example 3 | APS | 10.0 | 0.2 | NaCl | 0.3 | 1.0 | 3.5 | PS | 2.0 | 83.0 | 43.43 | ○ |
| Comparative Example 4 | SPS | 7.0 | 0.8 | ACl | 0.3 | 0.5 | 4.0 | SS | 3.7 | 83.7 | 73.18 | ○ |
| Comparative Example 5 | APS | 11.5 | 0.3 | NaCl | 0.2 | 1.1 | 2.5 | FS | 3.9 | 80.5 | 71.6 | ○ |

Referring to Table 1, it is found that the etchants of Examples 1 to 10 each exhibited a tip control index (Y) of at least about 45 and not more than about 70, and the etchants of Comparative Examples 1 to 5 each exhibited a Y of less than about 45 or greater than about 70. It was found that the etched samples of Examples 1 to 10 had excellent or suitable profiles without tip occurrence, whereas the etched samples of Comparative Examples 1 to 5 had substantially non-uniform profiles due to the occurrence of tips.

Referring to FIGS. 1 to 10, it was found that the samples of Examples 1 to 5 had no tip occurred on the upper portion, whereas the samples of Comparative Examples 1 to 5 had a tip of 0.1468 microns (μm), 0.1389 μm, 0.0992 μm, 0.3254 μm, or 0.4286 μm, respectively, occurred on the upper portion. Therefore, the etchants used in Examples 1 to 5 are found to have excellent or suitable etching efficiency and etch uniformity, compared to the etchants of Comparative Examples 1 to 5.

As described above, according to the one or more embodiments, the etchant can etch a multilayer film, and using the etchant, a defect rate can be reduced during the manufacture of display devices.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

As used herein, the terms "use," "using," and "used" may be considered synonymous with the terms "utilize," "utilizing," and "utilized," respectively.

The use of "may" when describing embodiments of the present disclosure refers to "one or more embodiments of the present disclosure."

As used herein, the singular forms "a", "an" and "the" are intended to include the plural forms as well, unless the context clearly indicates otherwise.

What is claimed is:

1. An etchant comprising:
   persulfate;
   a fluorine-containing compound;
   a chlorine-containing compound;
   a cyclic amine compound;
   an inorganic acid;
   sulfate; and
   water,
   wherein,
   a tip control index (Y) of the etchant is a value of at least about 45.0 and not more than about 70.0,
   the tip control index (Y) being a value calculated by <Equation 1>:

$$Y=1.0\times10^{-3}\times M(X1)+1.0\times10^{-1}\times M(X2)+5.0\times10^{-2}\times M(X3)+1.5\times M(X1)\times M(X2)+2.0\times10^{-1}\times M(X1)\times M(X3)+2.0\times10^{-1}\times M(X2)\times M(X3)$$ Equation 1 wherein, in Equation 1,
   M(X1) indicates wt % of the chlorine-containing compound with respect to 100 wt % in total of the etchant,
   M(X2) indicates wt % of the sulfate with respect to 100 wt % in total of the etchant, and
   M(X3) indicates wt % of the water with respect to 100 wt % in total of the etchant.

2. The etchant of claim 1, wherein the persulfate comprises ammonium persulfate, sodium persulfate, potassium persulfate, or one or more combinations thereof.

3. The etchant of claim 1, wherein the persulfate is ammonium persulfate.

4. The etchant of claim 1, wherein the fluorine-containing compound comprises ammonium fluoride, sodium fluoride, potassium fluoride, ammonium bifluoride, sodium bifluoride, potassium bifluoride, or one or more combinations thereof.

5. The etchant of claim 1, wherein the chlorine-containing compound comprises hydrochloric acid, sodium chloride, potassium chloride, ammonium chloride, iron (III) chloride, sodium perchlorate, potassium perchlorate, ethanesulfonyl chloride, methanesulfonyl chloride, or one or more combinations thereof.

6. The etchant of claim 1, wherein the cyclic amine compound comprises 5-aminotetrazole, imidazole, indole, purine, pyrazole, pyridine, pyrimidine, pyrrole, pyrrolidine, pyrroline, 5-methyltetrazole, 1-methyl-5-aminotetrazole, 1-ethyl-5-aminotetrazole, or one or more combinations thereof.

7. The etchant of claim 1, wherein the inorganic acid comprises nitric acid, sulfuric acid, phosphoric acid, phosphorous acid, or one or more combinations thereof.

8. The etchant of claim 1, wherein the sulfate comprises metal sulfate, an organic acid sulfate, or one or more combinations thereof.

9. The etchant of claim 1, wherein the sulfate comprises sodium sulfate, potassium sulfate, copper sulfate, titanium sulfate, ferric sulfate, ammonium sulfate, glucosamine sulfate, or one or more combinations thereof.

10. The etchant of claim 1, wherein the sulfate comprises sodium sulfate, potassium sulfate, ferric sulfate, or one or more combinations thereof.

11. The etchant of claim 1, wherein Y is at least about 45.3 and not more than about 68.0.

12. The etchant of claim 1, wherein, with respect to 100 wt % in total of the etchant,
    an amount of the persulfate is at least about 3.0 wt % and not more than about 15.0 wt %,
    an amount of the fluorine-containing compound is at least about 0.10 wt % and not more than about 2.0 wt %,
    an amount of the chlorine-containing compound is at least about 0.01 wt % and not more than about 1.0 wt %,
    an amount of the cyclic amine compound is at least about 0.10 wt % and not more than about 2.0 wt %,
    an amount of the inorganic acid is at least about 0.10 wt % and not more than about 5.0 wt %, and
    an amount of the sulfate is at least about 0.10 wt % and not more than about 7.0 wt %.

13. The etchant of claim 1, wherein an amount of the water is at least about 75 wt % and not more than about 85 wt %, with respect to 100 wt % in total of the etchant.

14. The etchant of claim 1, further comprising a surfactant, a metal ion sequestering agent, an anti-corrosive agent, a heat stabilizer, a thickener, glycol, or one or more combinations thereof.

15. The etchant of claim 1, wherein the etchant is for etching a metal film, a metal oxide film, or a combination thereof.

16. The etchant of claim 1, wherein the etchant is for etching a metal film or a metal oxide film.

17. The etchant of claim 15, wherein the metal film is a multilayer film.

18. The etchant of claim 15, wherein the metal film comprises copper, titanium, a titanium alloy, or one or more combinations thereof, and
    the titanium alloy comprises: titanium; and molybdenum (Mo), tantalum (Ta), chromium (Cr), nickel (Ni), neodymium (Nd), or one or more combinations thereof.

19. The etchant of claim 15, wherein the metal film comprises a first metal film, a second metal film, and a third metal film,
    the first metal film and the third metal film each independently comprise titanium or a titanium alloy,
    the titanium alloy comprises: titanium; and molybdenum (Mo), tantalum (Ta), chromium (Cr), nickel (Ni), neodymium (Nd), or one or more combinations thereof, and
    the second metal film comprises copper.

20. The etchant of claim 15, wherein the metal oxide film comprises an oxide of indium (In), tin (Sn), gallium (Ga), zinc (Zn), or one or more combinations thereof.

* * * * *